(12) United States Patent
Kim et al.

(10) Patent No.: US 9,231,715 B2
(45) Date of Patent: Jan. 5, 2016

(54) I/Q MISMATCH COMPENSATION METHOD AND APPARATUS

(71) Applicant: Samsung Electronics Co., Ltd., Gyeonggi-do (KR)

(72) Inventors: Donghan Kim, Gyeonggi-do (KR); Sungtae Choi, Gyeonggi-do (KR); Jaehwa Kim, Gyeonggi-do (KR); Yiju Roh, Gyeonggi-do (KR); Sanghoon Lee, Incheon (KR)

(73) Assignee: Samsung Electronics Co., Ltd (KR)

( * ) Notice: Subject to any disclaimer, the term of this patent is extended or adjusted under 35 U.S.C. 154(b) by 0 days.

(21) Appl. No.: 14/589,584

(22) Filed: Jan. 5, 2015

(65) Prior Publication Data

US 2015/0195050 A1 Jul. 9, 2015

(30) Foreign Application Priority Data

Jan. 3, 2014 (KR) ........................ 10-2014-0000614

(51) Int. Cl.
*H04B 1/38* (2015.01)
*H04B 17/14* (2015.01)
*H03D 3/00* (2006.01)
*H04L 27/36* (2006.01)
*H04L 27/38* (2006.01)
*H04B 17/21* (2015.01)
*H04B 17/24* (2015.01)
*H04L 1/24* (2006.01)

(52) U.S. Cl.
CPC ............... *H04B 17/14* (2015.01); *H03D 3/009* (2013.01); *H04B 17/21* (2015.01); *H04B 17/24* (2015.01); *H04L 27/364* (2013.01); *H04L 27/3863* (2013.01); *H04L 1/243* (2013.01)

(58) Field of Classification Search
CPC ........................................................ H04L 1/243
USPC ............................................................. 375/221
See application file for complete search history.

(56) References Cited

U.S. PATENT DOCUMENTS 6,084,862 A * 7/2000 Bjork et al. .................... 370/292
7,706,475 B1 * 4/2010 Kopikare et al. .............. 375/324
8,295,845 B1 * 10/2012 Abdollahi-Alibeik et al. ............................. 455/445

(Continued)

FOREIGN PATENT DOCUMENTS

WO WO 2013/011973 1/2013

OTHER PUBLICATIONS

Chinese Office Action dated May 15, 2015 issued in counterpart application No. 14200633.7-1851.

*Primary Examiner* — Santiago Garcia
(74) *Attorney, Agent, or Firm* — The Farrell Law Firm, P.C.

(57) ABSTRACT

An In-phase/Quadrature phase (I/Q) mismatch compensation method of a transceiver is provided. The method includes establishing a first loopback path between a transmitter and a receiver, transmitting a training sequence from the transmitter to the receiver through the established first loopback path, acquiring, at the receiver, a first correlation result value by correlating the training sequence received through the established first loopback path, establishing a second loopback path between the transmitter and the receiver, transmitting the training sequence from the transmitter to the receiver through the established second loopback path, acquiring, at the receiver, a second correlation result value by correlating the training sequence received through the second loopback path, and estimating I/Q mismatch values of the transmitter and the receiver using the first and second correlation result values.

16 Claims, 6 Drawing Sheets

(56) References Cited

U.S. PATENT DOCUMENTS

| | | |
|---|---|---|
| 2004/0217753 A1* | 11/2004 | Yamanaka et al. ......... 324/76.21 |
| 2004/0219884 A1 | 11/2004 | Mo et al. |
| 2005/0135464 A1* | 6/2005 | Lynch et al. .................. 375/150 |
| 2008/0002566 A1* | 1/2008 | Zhang et al. .................. 370/208 |
| 2008/0031311 A1* | 2/2008 | Haas et al. .................... 375/221 |
| 2008/0113628 A1* | 5/2008 | Muhammad et al. ........... 455/77 |
| 2010/0086078 A1* | 4/2010 | Dogan et al. .................. 375/295 |
| 2011/0110470 A1* | 5/2011 | Yu et al. ........................ 375/343 |
| 2013/0215558 A1* | 8/2013 | Lee et al. ................. 361/679.01 |
| 2014/0198830 A1* | 7/2014 | Sen et al. ....................... 375/150 |

\* cited by examiner

I/Q MISMATCH COMPENSATION METHOD AND APPARATUS

PRIORITY

This application claims priority under 35 U.S.C. §119(a) to Korean Patent Application Serial No. 10-2014-0000614, which was filed in the Korean Intellectual Property Office on Jan. 3, 2014, the entire disclosure of which is incorporated herein by reference.

BACKGROUND OF THE INVENTION

1. Field of the Invention

The present invention relates generally to an In-Phase/Quadrature Phase (I/Q) mismatch calibration method and apparatus, and more particularly, to a transceiver for use in any of Wireless Local Area Network (WLAN), Wireless Personal Area Network (PAN), and 3rd Generation (3G) and 4G cellular mobile communication systems.

2. Description of the Related Art

A mobile communication system can adopt Quadrature Modulation which uses orthogonal In-Phase (I) and Quadrature Phase (Q) simultaneously for up-conversion of a signal from baseband to passband and down-conversion from passband to baseband. The quadrature modulation is advantageous in terms of two-fold increase of transmission on a single carrier but disadvantageous in that a mismatch between the In-Phase and Quadrature Phase of the Local Oscillator (LO) causes mutual interference between I-phase and Q-phase signals and, thus, degrades system performance.

The I/Q mismatch may be divided into two categories, gain mismatch and phase mismatch. The gain mismatch denotes the difference in magnitude between I and Q components of the LO. The phase mismatch denotes the loss of the orthogonality in phase between I and Q components.

If the I/Q mismatch occurs at the quadrature modulator of a transceiver, this degrades Error Vector Magnitude (EVM) and increases Packet Error Rate (PER), resulting in degradation of entire system. Particularly, radio communication systems such as WLAN, WPAN, 3G and 4G cellular communication systems adopt high order modulation schemes including 16 Quadrature Amplitude Modulation (QAM), 64QAM, and 256QAM, which requires calibration of the transceiver I/Q due to the I/Q mismatch, i.e., the radio communication systems become more sensitive to the transceiver I/Q mismatch as the modulation order increases.

SUMMARY OF THE INVENTION

The present invention has been made to address at least the problems and/or disadvantages described above and to provide at least the advantages described below.

In accordance with an aspect of the present invention, an In-phase/Quadrature phase (I/Q) mismatch compensation method of a transceiver is provided. The method includes establishing a first loopback path between a transmitter and a receiver, transmitting a training sequence from the transmitter to the receiver through the established first loopback path, acquiring, at the receiver, a first correlation result value by correlating the training sequence received through the established first loopback path, establishing a second loopback path between the transmitter and the receiver, transmitting the training sequence from the transmitter to the receiver through the established second loopback path, acquiring, at the receiver, a second correlation result value by correlating the training sequence received through the second loopback path, and estimating I/Q mismatch values of the transmitter and the receiver using the first and second correlation result values.

In accordance with another aspect of the present invention, a transceiver for compensating for In-phase/Quadrature phase (I/Q) mismatch is provided. The transceiver includes a transmitter configured to generate a training sequence, a receiver configured to estimate an I/Q mismatch value based on the generated training sequence, and a controller configured to control establishing a first loopback path between a transmitter and a receiver, transmitting the generated training sequence from the transmitter to the receiver through the established first loopback path, acquiring, at the receiver, a first correlation result value by correlating the generated training sequence received through the established first loopback path, establishing a second loopback path between the transmitter and the receiver, transmitting the generated training sequence from the transmitter to the receiver through the established second loopback path, acquiring, at the receiver, a second correlation result value by correlating the generated training sequence received through the established second loopback path, and estimating I/Q mismatch values of the transmitter and the receiver using the first and second correlation result values.

BRIEF DESCRIPTION OF THE DRAWINGS

The above and other aspects, features, and advantages of certain embodiments of the present invention will be more apparent from the following detailed description when read in conjunction with the accompanying drawings, in which.

DETAILED DESCRIPTION OF EMBODIMENTS OF THE PRESENT INVENTION

One or more embodiments of the present invention will now be described more fully with reference to the accompanying drawings, in which embodiments of the invention are shown. The invention may, however, be embodied in many different forms, and should not be construed as being limited to the embodiments set forth herein. Thus, the invention may include all revisions, equivalents, or substitutions which are included in the concept and the technical scope related to the invention.

Although the description is directed to the IEEE 802.11ad communication access technology, it will be understood by those skilled in the art that the present invention can be applied to other communication systems having a similar technical background and channel format, with a slight modification, without departing from the spirit and scope of the present invention.

Figure 1:
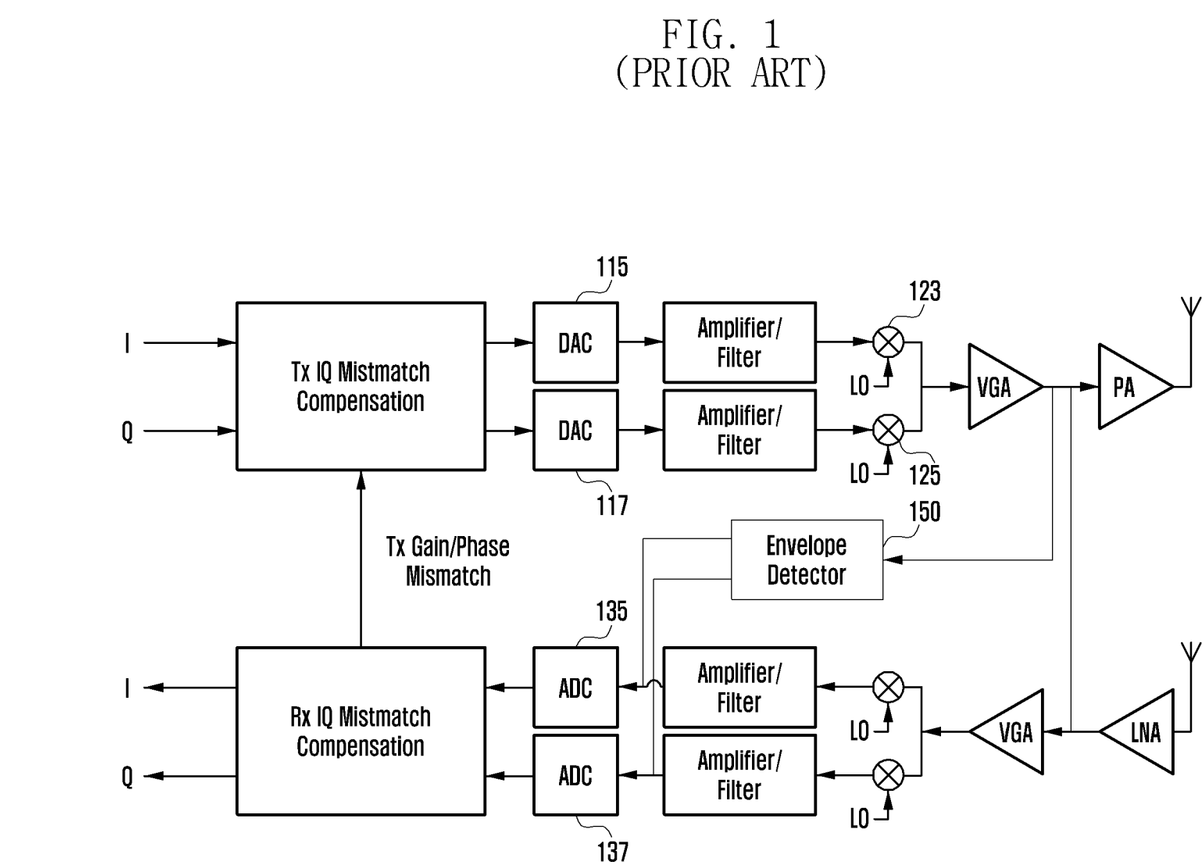
FIG. 1 is a circuit diagram illustrating a configuration of a conventional transceiver for I/O mismatch calibration.

FIG. 1 is a circuit diagram illustrating a configuration of the conventional transceiver for I/O mismatch calibration.

Referring to FIG. 1, the transceiver includes an envelope detector 150 between up-converters 123 and 125 of the RF unit and Analog To Digital Converters (ADCs) 135 and 137 of the receiver and is configured to cancel the I/Q mismatch of the transmitter and leakage of the LO of the transmitter. In this case, the transmitter may generate a tone to the Radio Frequency (RF) unit via Digital To Analog Converters (DACs) 115 and 117. This signal is sent to the ADCs 135 and 137 through the envelop detector 150 which allows the transceiver to estimate transmitter I/Q mismatch based on signal.

In this case, however, the envelope detector 150 is included in the RF unit as an extra component for I/Q mismatch calibration. Furthermore, the envelope detector 150 cannot be used to estimate the receiver I/Q mismatch. This means a need of a separate structure or algorithm to estimate the receiver I/Q mismatch.

Figure 2:
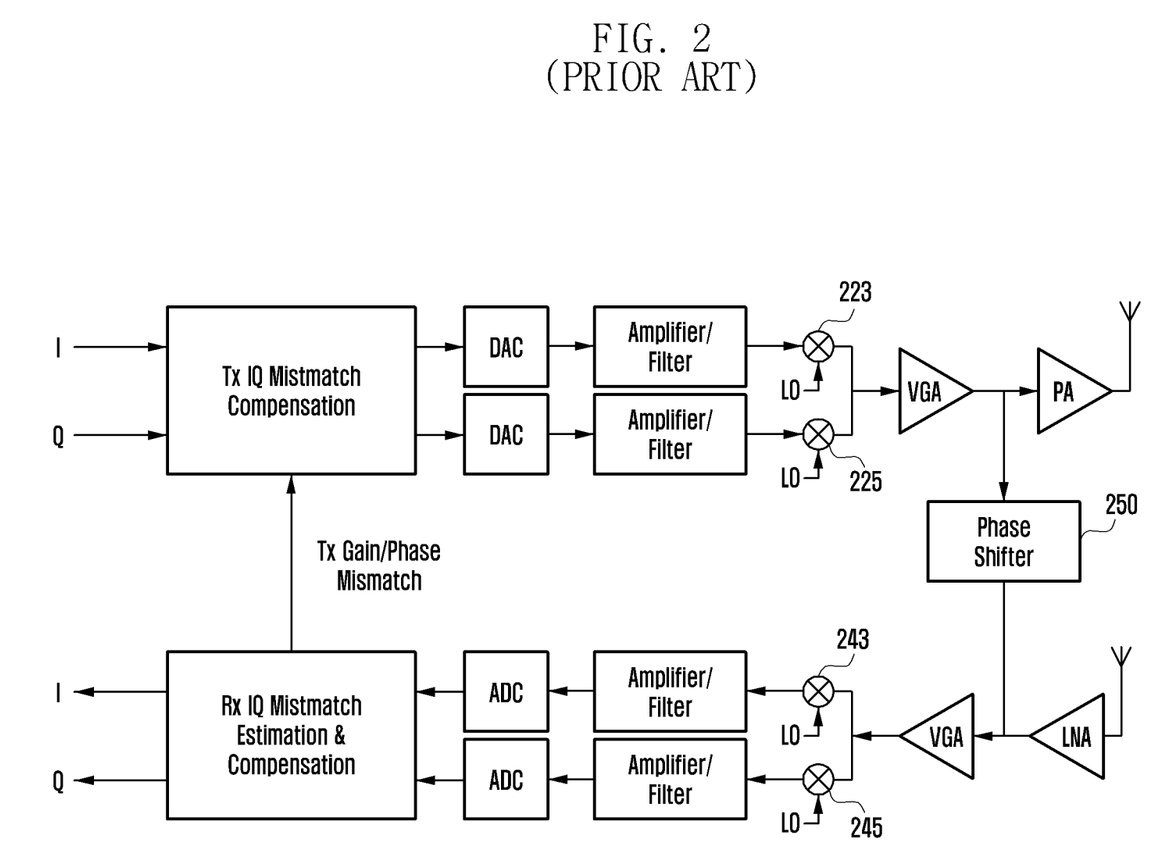
FIG. 2 is a circuit diagram illustrating a configuration of another conventional transceiver for I/Q mismatch calibration.

FIG. 2 is a circuit diagram illustrating a configuration of another conventional transceiver for I/Q mismatch calibration.

Referring to FIG. 2, the transceiver includes a phase shifter 250 between up-converters 223 and 225 of the transmitter of the RF unit and down converters 243 and 245 of the receiver to cancel the I/Q mismatch of the transmitter. Through this configuration, the phase shifter 250 can estimate I/Q mismatches of both the transmitter and receiver using a training sequence received at the receiver through the loopback path at angles of 0 and 90 degrees.

Even in this case, there is a need of the phase shifter 250 as an extra component in the RF unit for I/Q mismatch calibration, similar to the transceiver of FIG. 1. In order to estimate the I/Q mismatch, three or more different training sequences are, typically, required. This transceiver also has a drawback of large amount of calculation for estimating the I/Q mismatch.

An embodiment of the present invention provides a loopback path capable of being implemented for I/Q mismatch calibration and a training sequence suited for I/Q mismatch using the loopback path. A description is made herein of the algorithm and transceiver configuration for estimating I/Q mismatch, with small calculation amount, using the loopback path and training sequence, according to an embodiment of the present invention.

Figure 3:
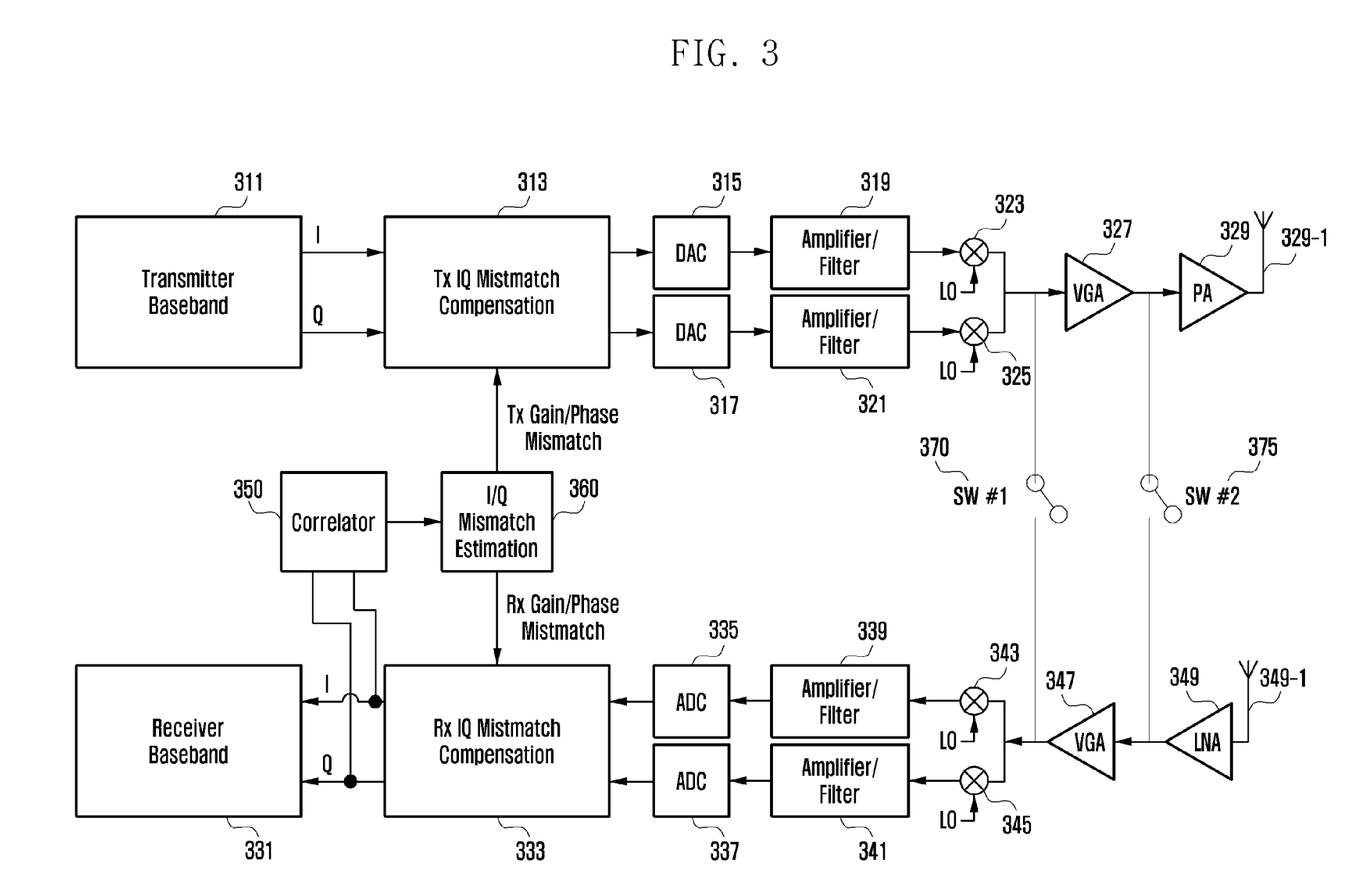
FIG. 3 is a circuit diagram illustrating a configuration of a transceiver for I/Q mismatch calibration, according to an embodiment of the present invention.
Figure 4:
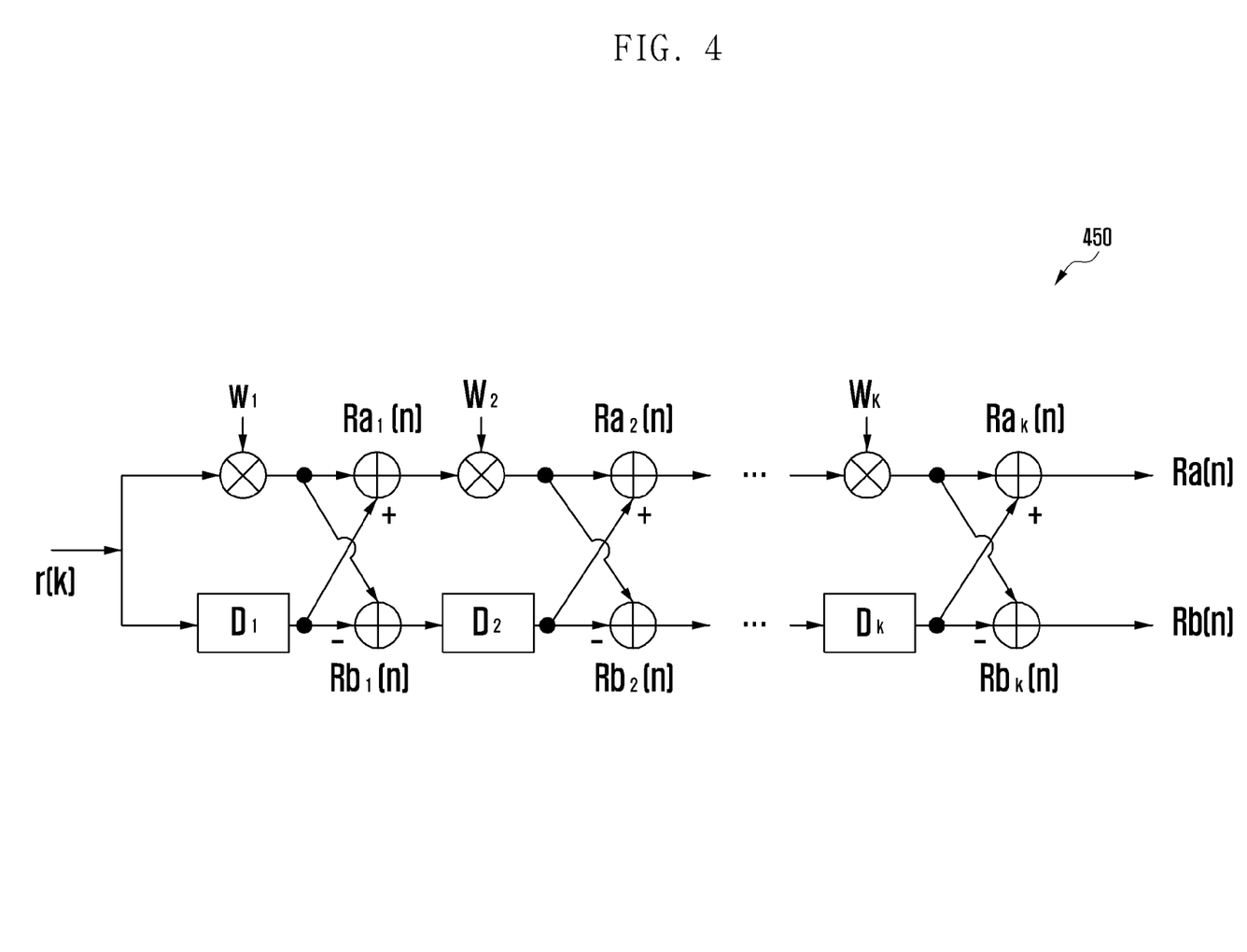
FIG. 4 is a circuit diagram illustrating a configuration of a Golay Correlator, according to an embodiment of the present invention.
Figure 5:
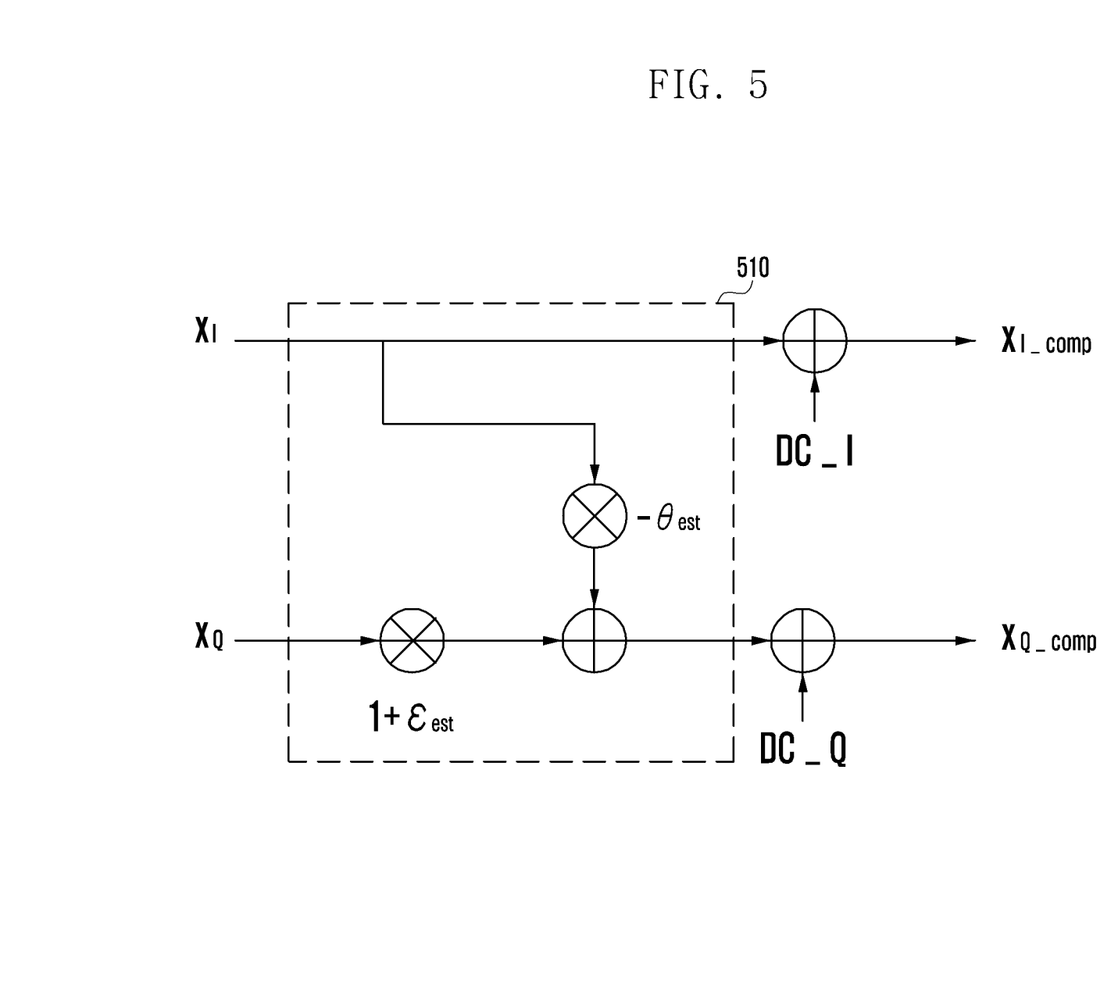
FIG. 5 is a circuit diagram illustrating an I/Q mismatch compensator, according to an embodiment of the present invention.

FIG. 3 is a circuit diagram illustrating a configuration of a transceiver for I/Q mismatch calibration, according to an embodiment of the present invention, FIG. 4 is a circuit diagram illustrating a configuration of a Golay Correlator, according to an embodiment of the present invention, and FIG. 5 is a circuit diagram illustrating an I/Q mismatch compensator, according to an embodiment of the present invention.

Referring to FIG. 3, a transmitter of the transceiver 300, according to an embodiment of the present invention, includes a transmitter baseband unit 311, a transmitter I/Q mismatch compensator 313, Digital To Analog Converters (DACs) 315 and 317, amplifier/filter units 319 and 321, up-converters 323 and 325, a Variable Gain Amplifier (VGA) 327, a Power Amplifier (PA), and a transmit antenna 329-1.

The transmitter baseband unit 311 performs baseband modulation on the signal to be transmitted and generates a training sequence necessary for I/Q mismatch calibration. The transmitter baseband unit 311 may include a training sequence generator for generating the training sequence as a separate component.

The transmitter I/Q mismatch compensator 313 compensates the transmission signal for the influence of I/Q mismatch using the I/Q mismatch estimation value of the transmitter.

The DACs 315 and 317 are responsible for converting a digital signal to an analog signal, and the amplifier/filter units 319 and 321 perform amplifying and filtering on the analog transmission signal. The up-converters 323 and 325 up-convert a baseband signal to a passband signal.

The VGA 327 adjusts the transmit power of the transmitter, and the PA 329 amplifies the transmission signal to a high power level for transmission through the transmit antenna 329-1.

The training sequence generator generates a binary sequence having a good correlation characteristic. The binary sequence may be the Golay sequence specified in the IEEE 802.11ad, a Constant Amplitude Zero Auto-Correlation (CAZAC) sequence, or a Walsh-Hadamard sequence specified in the Long-Term Evolution (LTE) standard, but not limited thereto. For example, the training sequence generator stores the binary sequence in a Read Only memory (ROM) and reads it from the ROM if necessary.

The receiver of the transceiver 300 includes a receive antenna 349-1, a Low Noise Amplifier (LNA) 349, a VGA 347, down-converters 343 and 345, amplifier/filter units 339 and 341, Analog-To-Digital Converters (ADCs) 335 and 337, a receiver I/Q mismatch compensator 333, and a receiver baseband unit 331. The receiver further includes a correlator 350 and an I/Q mismatch estimator 360.

The LNA 349 is responsible for canceling noise of the received signal, and the VGA 347 amplifies the received signal to an appropriate power level.

The down-converters 343 and 345 convert a passband signal to the baseband signal, and the amplifier/filter units 339 and 341 amplify and filter the received signal. The ADCs 335 and 337 convert the analog signal to digital signal.

The receiver I/Q mismatch compensator 333 compensates the received signal for the influence of the I/Q mismatch using the I/Q mismatch estimation value of the receiver.

The correlator 350 on the training sequence and the I/Q mismatch estimator 360 calculate I/Q mismatches of the transmitter and receiver using a correlation value. The correlator 350 of the receiver matches the training sequence sent to the transmitter and outputs the peak result value when the received signal completely matches the correlator 350. The correlator can be implemented soley with adders but not multipliers, e.g., in the case of using a binary sequence as the training sequence. This is advantageous in terms of small calculation amount, and the calculation amount may further decreased by using the Golay correlator 450, as configured in FIG. 4. A detailed description of the configuration and operation of the Golay correlator 450 is omitted herein.

The transmitter I/Q mismatch compensator 313 and the receiver I/Q mismatch compensator 333 receive the I/Q mismatch estimation values of the transmitter and the receiver from the I/Q mismatch estimator 360. The transmitter I/Q mismatch compensator 313 removes the I/Q mismatch influence of the transmission signal. Also, the receiver I/Q mismatch compensator 333 removes the I/Q mismatch influence of the received signal, as described below.

The transceiver 300 uses two or more loopback paths for connecting the transmitter and receiver in the RF unit in order to estimate I/Q mismatch. The loopback path may be implemented by connecting a module output of the transmitter and a module input of the receiver from among the modules constituting the RF unit. Alternatively, it is possible to configure two loopback paths by connecting the module output of different transmitters and the module input of the receiver.

The first loopback path may be established by connecting the output node of the up-converters 323 and 325 to the input nodes of the down-converters 339 and 341. The second loopback path may be established by connecting the output node of the VGA 327 of the transmitter and the input node of the VGA 347 of the receiver. The loopback paths include the switches 370 and 375 respectively. That is, the first loopback path includes the first switch 370, and the second loopback path includes the second switch 375. The loopback paths are established or cut off by turning on/off the first and second switches 370 and 375. For example, the training sequence may be received through the first loopback path, which is established by turning on the first switch 370 and off the second switch 375, or through the second loopback path, which is established by turning off the first switch 370 and on the second switch 375.

Figure 6:
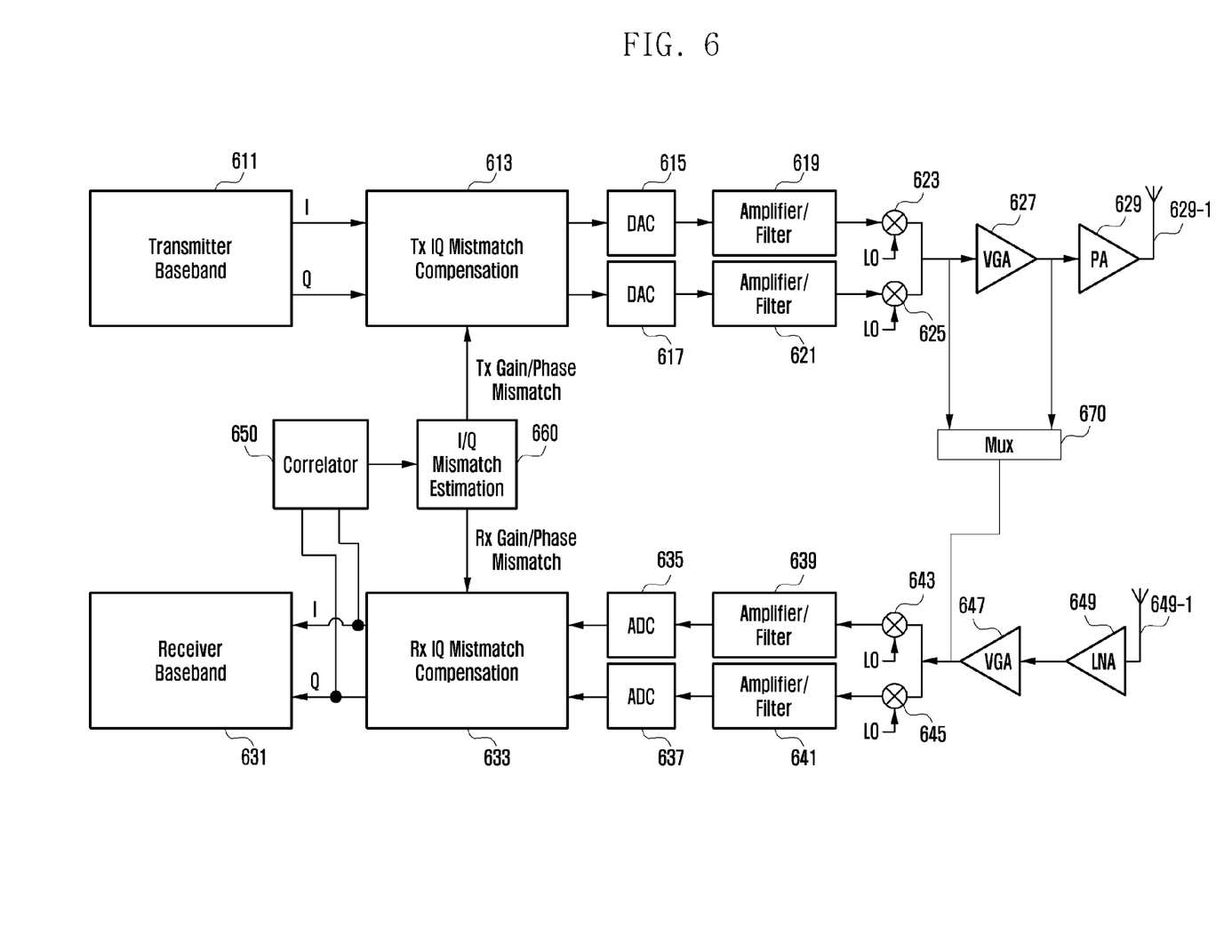
FIG. 6 is a circuit diagram illustrating a configuration of the transceiver for I/Q mismatch calibration, according to another embodiment of the present invention.

A description of another embodiment of establishing two or more loopback paths connecting the transmitter and the receiver in the RF unit for I/Q mismatch estimation of the transceiver is made with reference to FIG. 6.

FIG. 6 is a circuit diagram illustrating a configuration of the transceiver for I/Q mismatch calibration, according to another embodiment of the present invention.

The transmitter of the transceiver 600 includes a transmitter baseband unit 611, a transmitter I/Q mismatch compensator 613, DACs 615 and 617, amplifier/filter units 619 and 621, up-converters 623 and 625, a VGA 627, a PA 629, and a transmit antenna 629-1. A detailed description of the operations of the components of the transmitter illustrated in FIG. 6, which are identical to those of the transmitter in FIG. 3, is omitted herein.

The receiver of the transceiver 600 includes a receive antenna 649-1, an LNA 649, a VGA 647, down converters 643 and 645, amplifier/filter units 639 and 641, ADCs 635 and 637, a receiver I/Q mismatch compensator 633, and a receiver baseband unit 631. The receiver further includes a correlator 650 and an I/Q mismatch estimator 660. A detailed description of the operations of the components of the receiver illustrated in FIG. 6, which are identical to those of the receiver in FIG. 3, is omitted herein.

The transceiver 300 includes two or more loopback paths which connect the transmitter and the receiver in the RF unit for I/Q mismatch estimation. As shown in FIG. 6, different versions of an output of the transmitter are input to the multiplexer (Mux) 670, and the output of the Mux 670 is connected to the receiver. The Mux 670 is capable of changing one input selectively to implement two loopback paths.

The transceiver is not limited to the configurations as described above and can be implemented in different configurations. For example, although the description is directed to the case where the correlator is included in the receiver, the correlator may be included in the transmitter.

The I/Q mismatch calibration operation of the RF transceiver, according to an embodiment of the present invention, is described with reference to the transceiver 300 of FIG. 3.

The first loopback path is established between the transmitter and the receiver by turning on the switch 370 and turning off the switch 375 in the RF unit.

Next, the baseband unit 311 of the transmitter generates a training sequence necessary for I/Q mismatch calibration. The training sequence may be generated by a training sequence generator included in the baseband unit 311 of the transmitter. As described above, the training sequence may be a binary sequence.

The training sequence is transferred to the DACs 315 and 317. The receiver correlates the training sequence received from the ADCs 335 and 337 via the correlator 350 to output the result value to the I/Q mismatch estimator 360.

If the first correlation has been completed, the first loopback path is cut off, and the second loopback path is established between the transmitter and the receiver. That is, the first switch 370 turns off, and the second switch 375 turns on to establish the second loopback path between the transmitter and the receiver.

Next, the baseband unit 311 of the transmitter generates a training sequence which is identical to the training sequence transmitted through the first loopback path. The training sequence generator included in the baseband unit 311 of the transmitter generates the training sequence, which is identical with the training sequence transmitted through the first loopback path.

The training sequence is sent to the receiver through the second loopback path and the ADCs 335 and 337. The ADCs 335 and 337 send the training sequence to the correlator 350, which performs correlation and sends the resultant value to the I/Q mismatch estimator 360.

Next, the I/Q mismatch estimator 360 estimates the transmitter gain mismatch, transmitter phase mismatch, receiver gain mismatch, and receiver phase mismatch using the correlation value of the training sequence received through the two loopback paths, as described below.

The estimated transmitter gain and phase mismatch values are transferred to the I/Q mismatch compensator 313 of the transmitter. Next, the I/Q mismatch compensator 313 of the transmitter removes the I/Q mismatch influence of the transmitter using the transmitter gain and phase mismatch values.

Likewise, the estimated receiver gain and phase mismatch values are transferred to the I/Q mismatch compensator 333 of the receiver. Next, the I/Q mismatch compensator 333 of the receiver removes the I/Q mismatch influence of the receiver using the receiver gain and phase mismatch values.

The I/Q mismatch calibration operation of the transceiver, according to an embodiment of the present invention, may be implemented using the Mux 670, as shown in FIG. 6. That is, the Mux 670 is capable of establishing two or more loopback paths by switching between the inputs to transfer the same training sequence through the respective loopback paths, thereby obtaining the same effect of using the two switches 370 and 375.

A description of the I/Q mismatch estimation operation, according to an embodiment of the present invention is now described.

The transceiver 300 (or 600) establishes the first loopback path between the transmitter and the receiver in order for the transmitter training sequence generator to transmit the training sequence. At this time, the signal r1 received by the receiver through the first loopback path can be expressed as Equation (1):

$$r_1 = r_{I1} + jr_{Q1} \qquad (1)$$
$$= (\cos\phi_1 + i\sin\phi_1)x + $$
$$\left(\cos\phi_1\left(\frac{\varepsilon_{Tx} + \varepsilon_{Rx}}{2}\right) - \sin\phi_1\left(\frac{\theta_{Tx} - \theta_{Rx}}{2}\right) + \right.$$
$$\left. i\sin\phi_1\left(\frac{\varepsilon_{Tx} + \varepsilon_{Rx}}{2}\right) + \cos\phi_1\left(\frac{\theta_{Rx} + \theta_{Tx}}{2}\right)\right)x^*,$$

where x denotes the transmitted training sequence, and $\varepsilon_{Tx}$, $\theta_{Tx}$, $\varepsilon_{Rx}$, and $\theta_{Rx}$ denote transmitter gain and phase mismatches and receiver gain and phase mismatches respectively. Also, φ1 denotes the phase delay of the training sequence received through the first loopback path of the RF unit.

The transceiver establishes the second loopback path between the transmitter and the receiver in order for the transmitter training sequence generator to transmit the training sequence. At this time, the signal r2 received by the receiver through the second loopback path can be expressed as Equation (2):

$$r_2 = r_{I2} + jr_{Q2} \qquad (2)$$
$$= (\cos\phi_2 + i\sin\phi_2)x +$$
$$\left(\cos\phi_2\left(\frac{\varepsilon_{Tx} + \varepsilon_{Rx}}{2}\right) - \sin\phi_2\left(\frac{\theta_{Tx} - \theta_{Rx}}{2}\right) + i\sin\phi_2\left(\frac{\varepsilon_{Tx} - \varepsilon_{Rx}}{2}\right) + \cos\phi_2\left(\frac{\theta_{Rx} + \theta_{Tx}}{2}\right)\right)x^*,$$

where φ2 denotes the phase delay of the training sequence received through the second loopback path of the RF unit, x denotes the transmitted training sequence, and $\epsilon Tx$, $\theta Tx$, $\epsilon Rx$, and $\theta Rx$ denote transmitter gain and phase mismatches and receiver gain and phase mismatches respectively.

From Equations (1) and (2), if there is I/Q mismatch between the transmitter and the receiver, the complex-conjugated signal x* occurs as self-interference to the original signal x so as to degrades the EVM of the received signal.

In order to estimate the I/Q mismatch value using Equations (1) and (2), it is necessary to find φ1 and φ2, as well as $\epsilon Tx$, $\theta Tx$, $\epsilon Rx$, and $\theta Rx$. The training sequence for use in I/Q mismatch estimation is a Pseudo Random Noise Sequence (such as a Golay Sequence, a CAZAC sequence, and a Walsh-Hadamard Sequence) which uses Equations (3) and (4) for the sequence length N, as shown below:

$$\sum_{n=0}^{N-1} x(n) \cdot x(n) = \sum_{n=0}^{N-1} x^*(n) \cdot x^*(n) = 0, \qquad (3)$$

$$\sum_{k=0}^{N-1} x(k) \cdot x^*(k) = 1. \qquad (4)$$

Equation (4) shows the correlation mathematically and can be implemented as a correlator suitable for the training sequence. When using the Golay sequence as the training sequence, it is possible to implement the correlator with small calculation amount using the Golay correlator. When using the CAZAC sequence or Walsh-Hadamard sequence, it is possible to implement the correlator in similar ways.

Using Equations (3) and (4), it is possible to calculate cos φ1, sin φ1, cos φ2, and sin φ2 as shown in Equations (5) to (8):

$$\cos\phi_1 = \operatorname{real}\left(\frac{1}{N} \cdot \sum_{n=0}^{N-1} r_1(n) \cdot x^*(n)\right) \qquad (5)$$

$$\sin\phi_1 = \operatorname{imag}\left(\frac{1}{N} \cdot \sum_{n=0}^{N-1} r_1(n) \cdot x^*(n)\right) \qquad (6)$$

$$\cos\phi_2 = \operatorname{real}\left(\frac{1}{N} \cdot \sum_{n=0}^{N-1} r_2(n) \cdot x^*(n)\right) \qquad (7)$$

$$\sin\phi_2 = \operatorname{imag}\left(\frac{1}{N} \cdot \sum_{n=0}^{N-1} r_2(n) \cdot x^*(n)\right) \qquad (8)$$

Also, using $\epsilon Tx$, $\theta Tx$, $\epsilon Rx$, and $\theta Rx$, it is possible to express $\epsilon Tx$, $\theta Tx$, $\epsilon Rx$, and $\theta Rx$ as shown in Equations (9) to (12):

$$\cos\phi_1 \frac{\varepsilon_{Tx} + \varepsilon_{Rx}}{2} - \sin\phi_1 \frac{\theta_{Tx} - \theta_{Rx}}{2} = \operatorname{real}\left(\frac{1}{N} \cdot \sum_{n=0}^{N-1} r_1(n) \cdot x(n)\right) = A, \qquad (9)$$

$$\sin\phi_1 \frac{\varepsilon_{Tx} - \varepsilon_{Rx}}{2} + \cos\phi_1 \frac{\theta_{Rx} + \theta_{Tx}}{2} = \operatorname{imag}\left(\frac{1}{N} \cdot \sum_{n=0}^{N-1} r_1(n) \cdot x(n)\right) = B, \qquad (10)$$

$$\cos\phi_2 \frac{\varepsilon_{Tx} + \varepsilon_{Rx}}{2} - \sin\phi_2 \frac{\theta_{Tx} - \theta_{Rx}}{2} = \operatorname{real}\left(\frac{1}{N} \cdot \sum_{n=0}^{N-1} r_2(n) \cdot x(n)\right) = C, \qquad (11)$$

$$\sin\phi_2 \frac{\varepsilon_{Tx} - \varepsilon_{Rx}}{2} + \cos\phi_2 \frac{\theta_{Rx} + \theta_{Tx}}{2} = \operatorname{imag}\left(\frac{1}{N} \cdot \sum_{n=0}^{N-1} r_2(n) \cdot x(n)\right) = D. \qquad (12)$$

This can be expressed in the form of a matrix as Equation (13):

$$\begin{pmatrix} \cos\phi_1 & \cos\phi_1 & -\sin\phi_1 & \sin\phi_1 \\ \sin\phi_1 & -\sin\phi_1 & \cos\phi_1 & \cos\phi_1 \\ \cos\phi_2 & \cos\phi_2 & -\sin\phi_2 & \sin\phi_2 \\ \sin\phi_2 & -\sin\phi_2 & \cos\phi_2 & \cos\phi_2 \end{pmatrix} \cdot \begin{pmatrix} \varepsilon_{Tx} \\ \varepsilon_{Rx} \\ \theta_{Tx} \\ \theta_{Rx} \end{pmatrix} = \begin{pmatrix} A \\ B \\ C \\ D \end{pmatrix}. \qquad (13)$$

Accordingly, $\epsilon Tx$, $\theta Tx$, $\epsilon Rx$, and $\theta Rx$ can be estimated through Equation (14), using cos φ1, sin φ1, cos φ2, and sin φ2 obtained by Equations (5) to (8), as shown below:

$$\begin{pmatrix} \varepsilon_{Tx} \\ \varepsilon_{Rx} \\ \theta_{Tx} \\ \theta_{Rx} \end{pmatrix} = \begin{pmatrix} \cos\phi_1 & \cos\phi_1 & -\sin\phi_1 & \sin\phi_1 \\ \sin\phi_1 & -\sin\phi_1 & \cos\phi_1 & \cos\phi_1 \\ \cos\phi_2 & \cos\phi_2 & -\sin\phi_2 & \sin\phi_2 \\ \sin\phi_2 & -\sin\phi_2 & \cos\phi_2 & \cos\phi_2 \end{pmatrix}^{-1} \cdot \begin{pmatrix} A \\ B \\ C \\ D \end{pmatrix}. \qquad (14)$$

That is, the I/Q mismatch estimation, according to the present invention, obtains cos φ1, sin φ1, cos φ2, and sin φ2 by correlating the training sequence signal known at the receiver to the received training sequence. It is possible to calculate the I/Q mismatch through a simple matrix operation using the value obtained by correlating the complex conjugate signal of the training sequence and the cos φ1, sin φ1, cos φ2, and sin φ2.

Since the training sequences pass through a different number of modules, which have different gains in the RF unit, the received training sequences are different in size. However, the I/Q mismatch estimation algorithm, in accordance with the present invention, is capable of estimating the I/Q mismatch independently of the size of the received signal.

Meanwhile, in the case of using the Golay Sequence, e.g., for use in the IEEE 802.11ad, the correlation can be performed using the Golay Sequence. In the case of using the CAZAC sequence or the Walsh-Hadamard sequence as the training sequence, it is possible to design the correlator structure matching the corresponding sequence.

Since the training sequences are of the binary type, the correlation can be calculated using addition, without using multiplication.

Table 1 shows the difference in calculation amount according to the length of the training sequence between the transceiver of FIG. 2, which uses the phase shifter and the transceiver, according to an embodiment of the present invention.

TABLE 1

|  | Multiplication | Addition |
|---|---|---|
| Transceiver implemented with Phase Shifter | N * 6 | (N + 1) * 6 |
| Transceiver implemented according to an embodiment of the present invention | — | 512 * 8 |

As shown in Table 1, the number of multiplication operations increases in proportion to the training sequence length N in the case of the transceiver implemented with the phase shift. The transceiver according to an embodiment of the present invention uses only addition without multiplication.

The correlator can be used for both baseband synchronization and channel estimation. The correlator can be implemented in hardware or software. The function of calculating the cos φ1, sin φ1, cos φ2, and sin φ2 using the correlation output value may be more efficient in the case of being implemented in software in view of implementation flexibility. However, the hardware implementation is also possible in consideration of the estimation speed.

The ϵTx, θTx, ϵRx, and θRx, estimated as above, are transferred to the I/Q mismatch compensator 313 (613) of the transmitter and the I/Q mismatch compensator 333 (633) of the receiver to compensate for the gain and phase mismatches of the transmitter and receiver. The I/Q mismatch compensators 313 (613) and 333 (633) can be implemented as shown in FIG. 5. The I/Q mismatch compensator 313, 333, 613, and 633 can be implemented in hardware in consideration of the system speed.

Although not shown in the drawings, the transceiver 300 (600), according to an embodiment of the present invention, may include a control unit for controlling the overall operations of the transceiver. The control unit may control the transceiver to execute the operation of one of the above described embodiments. For example, the control unit may control the baseband unit to generate the training sequence and may control the switch or multiplexer to establish the first and/or second loopback paths. The control unit also may control the correlator to perform correlation using the received training sequence and control the I/Q mismatch estimator to calculate the I/Q mismatches of the transmitter and the receiver using the correlation value.

The I/Q mismatch calibration method is capable of implementing the loopback path between the transmitter and the receiver in the RF. Unlike the technologies of FIGS. 1 and 2, which require extra component such as an envelope detector or a phase shifter to establish the loopback path, the transceiver according to an embodiment of the present invention is capable of establishing two loopback paths simply with switches or a Mux. This means that it is possible to simplify the implementation and inspection of the RF unit and reduce the size of the RF unit.

From the view point of baseband, it is possible to estimate the I/Q mismatches of both the transmitter and receiver simultaneously using the correlator having relatively small calculation amount and matrix operation. That is, the I/Q mismatch calibration method of the present invention is advantageous in terms of reducing the calculation amount required for I/Q mismatch calibration.

Also, the correlator proposed in the present invention can be configured for use in baseband synchronization and channel estimation so as to reduce the load of software and the size of the flash memory for storing software code.

As described above, the I/Q mismatch calibration method and apparatus of the present invention is advantageous in terms of implementing the loopback path inside the RF module without extra device, e.g., an envelope detector or a phase shifter.

Also, the I/Q mismatch calibration method and apparatus of the present invention is advantageous in terms of making it possible to reduce the hardware gate size and/or software code size due to the reduced calculation amount of the I/Q mismatch estimation algorithm.

Moreover, the I/Q mismatch calibration method and apparatus of the present invention is advantageous in terms of reducing the form factor of the chip on which the transceiver is disposed.

Further, the I/Q mismatch calibration method and apparatus of the present invention is advantageous in terms of facilitating I/Q mismatch calibration by reducing the calculation amount and/or time of the algorithm and by estimating the I/Q mismatch using only the training sequence transmission twice.

Also, the I/Q mismatch calibration method and apparatus of the present invention is advantageous in terms of reducing the boot-up time by minimizing the I/Q mismatch calibration time on the initialization of the communication system.

While one or more embodiments of the present invention have been described with reference to the figures, it will be understood by those of ordinary skill in the art that various changes in form and details may be made therein without departing from the spirit and scope of the present invention as defined by the following claims and their equivalents.

What is claimed is:

1. An In-phase/Quadrature phase (I/Q) mismatch compensation method of a transceiver, the method comprising:
    establishing a first loopback path between a transmitter and a receiver;
    transmitting a first training sequence from the transmitter to the receiver through the established first loopback path;
    acquiring, at the receiver, a first correlation result value by correlating the first training sequence received through the established first loopback path;
    establishing a second loopback path between the transmitter and the receiver;
    transmitting a second training sequence from the transmitter to the receiver through the established second loopback path;
    acquiring, at the receiver, a second correlation result value by correlating the second training sequence received through the second loopback path; and
    estimating I/Q mismatch values of the transmitter and the receiver using the first and second correlation result values;
    wherein the first loopback path is established by turning on a first switch interposed between a first module input node of the transmitter and a first module output node of the receiver and turning off a second switch interposed between a second module output node of the transmitter and a second module input node of the receiver, and the second loopback path is established by turning off the first switch and turning on the second switch.

2. The method of claim 1, wherein each of the first and second training sequences is a binary sequence.

3. The method of claim 1, wherein the first and second loopback paths are established selectively by controlling a multiplexer interposed between at least two output nodes of the transmitter and at least one input node of the receiver.

4. The method of claim 1, wherein estimating the I/Q mismatch values comprises:
transmitting the first and second correlation result values to a correlator of the receiver;
estimating gain and phase mismatch values of the transmitter and gain and phase mismatch values of the receiver using the first and second correlation result values; and
transmitting the estimated gain and phase mismatch values of the transmitter to a transmitter I/Q mismatch compensator of the transmitter and the gain and phase mismatch values of the receiver to a receiver I/Q mismatch compensator of the receiver.

5. The method of claim 2, wherein the binary sequence is one of a Golay sequence, a Constant Amplitude Zero Auto-Correlation (CAZAC) sequence, and a Walsh-Hadamard sequence.

6. The method of claim 5, wherein the first and second correlation result values are acquired from a correlator of the receiver.

7. The method of claim 1, wherein estimating the I/Q mismatch values comprises:
estimating the I/Q mismatch values of the transmitter and the receiver using:

$$\begin{pmatrix} \varepsilon_{Tx} \\ \varepsilon_{Rx} \\ \theta_{Tx} \\ \theta_{Rx} \end{pmatrix} = \begin{pmatrix} \cos\phi_1 & \cos\phi_1 & -\sin\phi_1 & \sin\phi_1 \\ \sin\phi_1 & -\sin\phi_1 & \cos\phi_1 & \cos\phi_1 \\ \cos\phi_2 & \cos\phi_2 & -\sin\phi_2 & \sin\phi_2 \\ \sin\phi_2 & -\sin\phi_2 & \cos\phi_2 & \cos\phi_2 \end{pmatrix}^{-1} \cdot \begin{pmatrix} A \\ B \\ C \\ D \end{pmatrix},$$

where $\varepsilon Tx$, $\theta Tx$, $\varepsilon Rx$, and $\theta Rx$ denote transmitter gain and phase mismatches and receiver gain and phase mismatches respectively, $\phi 1$ denotes phase delay of the first training sequence received through the established first loopback path of a Radio Frequency (RF) unit, and $\phi 2$ denotes a phase delay of the second training sequence received through the established second loopback path of the RF unit.

8. The method of claim 7, wherein A and B are calculated using the first training sequence received through the established first loopback path and the training sequence generated at the transmitter, and C and D are calculated using the second training sequence received through the established second loopback path and the training sequence generated at the transmitter.

9. A transceiver for compensating for In-phase/Quadrature phase (I/Q) mismatch, the transceiver comprising:
a transmitter configured to generate a first and a second training sequence;
a receiver configured to estimate an I/Q mismatch value based on the generated first and second training sequence;
a controller configured to control establishing a first loopback path between a transmitter and a receiver, transmitting the generated first training sequence from the transmitter to the receiver through the established first loopback path, acquiring, at the receiver, a first correlation result value by correlating the generated first training sequence received through the established first loopback path, establishing a second loopback path between the transmitter and the receiver, transmitting the generated second training sequence from the transmitter to the receiver through the established second loopback path, acquiring, at the receiver, a second correlation result value by correlating the generated second training sequence received through the established second loopback path, and estimating I/Q mismatch values of the transmitter and the receiver using the first and second correlation result values;
a first switch interposed between a first module input node of the transmitter and a first module output node of the receiver; and
a second switch interposed between a second module input mode of the transmitter and a second module input node of the receiver,
wherein the controller is configured to control the first switch to turn on and the second switch to turn off to establish the first loopback path and to control the first switch to turn off and the second switch to turn on to establish the second loopback path.

10. The transceiver of claim 9, wherein each of the first and second training sequences is a binary sequence.

11. The transceiver of claim 9, further comprising a multiplexer (Mux) interposed between at least two output nodes of the transmitter and at least one input node of the receiver,
wherein the controller is configured to control the multiplexer (Mux) to selectively establish the first and second loopback paths.

12. The transceiver of claim 9, further comprising a correlator of the receiver, configured to receive the first and second correlation result values,
wherein the controller is configured to estimate gain and phase mismatch values of the transmitter and gain and phase mismatch values of the receiver using the first and second correlation result values, and to control transmitting the gain and phase mismatch values of the transmitter to a transmitter I/Q mismatch compensator of the transmitter and the gain and phase mismatch values of the receiver to a receiver I/Q mismatch compensator of the receiver.

13. The transceiver of claim 10, wherein the binary sequence is one of a Golay sequence, a Constant Amplitude Zero Auto-Correlation (CAZAC) sequence, and a Walsh-Hadamard sequence.

14. The transceiver of claim 13, further comprising a correlator of the receiver, the correlator configured to acquire the first and second correlation result values.

15. The transceiver of claim 9, wherein the controller is configured to estimate the I/Q mismatch values of the transmitter and the receiver using:

$$\begin{pmatrix} \varepsilon_{Tx} \\ \varepsilon_{Rx} \\ \theta_{Tx} \\ \theta_{Rx} \end{pmatrix} = \begin{pmatrix} \cos\phi_1 & \cos\phi_1 & -\sin\phi_1 & \sin\phi_1 \\ \sin\phi_1 & -\sin\phi_1 & \cos\phi_1 & \cos\phi_1 \\ \cos\phi_2 & \cos\phi_2 & -\sin\phi_2 & \sin\phi_2 \\ \sin\phi_2 & -\sin\phi_2 & \cos\phi_2 & \cos\phi_2 \end{pmatrix}^{-1} \cdot \begin{pmatrix} A \\ B \\ C \\ D \end{pmatrix},$$

where $\varepsilon Tx$, $\theta Tx$, $\varepsilon Rx$, and $\theta Rx$ denote transmitter gain and phase mismatches and receiver gain and phase mismatches respectively, $\phi 1$ denotes phase delay of the first training sequence received through the established first loopback path of a Radio Frequency (RF) unit, and $\phi 2$ denotes a phase delay of the second training sequence received through the established second loopback path of the RF unit.

16. The transceiver of claim 15, wherein A and B are calculated using the first training sequence received through the established first loopback path and the training sequence generated at the transmitter, and C and D are calculated using the second training sequence received through the established second loopback path and the training sequence generated at the transmitter.

\* \* \* \* \*